(12) United States Patent
Jeong et al.

(10) Patent No.: US 7,075,853 B2
(45) Date of Patent: Jul. 11, 2006

(54) SEMICONDUCTOR MEMORY DEVICE INCLUDING INTERNAL CLOCK DOUBLER

(75) Inventors: Duk Ju Jeong, Seoul (KR); Tae Woo Kwon, Gyeongsangnam-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 178 days.

(21) Appl. No.: 10/879,139

(22) Filed: Jun. 30, 2004

(65) Prior Publication Data

US 2005/0226091 A1 Oct. 13, 2005

(30) Foreign Application Priority Data

Apr. 12, 2004 (KR) .................. 10-2004-0024965

(51) Int. Cl.
*G11C 8/00* (2006.01)
(52) U.S. Cl. .................. 365/233; 365/191; 365/194; 365/230.08
(58) Field of Classification Search ................ 365/233, 365/191, 194, 230.08
See application file for complete search history.

(56) References Cited

U.S. PATENT DOCUMENTS

| 5,748,522 | A | 5/1998 | Piguet et al. |
| 5,802,594 | A | 9/1998 | Wong et al. |
| 6,016,283 | A * | 1/2000 | Jeong .................. 365/233 |
| 6,232,845 | B1 | 5/2001 | Kingsley et al. |
| 6,269,041 | B1 | 7/2001 | Wang et al. |
| 6,324,122 | B1 * | 11/2001 | Sun et al. .................. 365/233 |
| 6,539,508 | B1 | 3/2003 | Patrie et al. |

FOREIGN PATENT DOCUMENTS

| JP | 3-237682 | 10/1991 |
| JP | 6-150661 | 5/1994 |
| JP | 2004-110996 | 4/2004 |

* cited by examiner

*Primary Examiner*—Tuan T. Nguyen
*Assistant Examiner*—Pho M. Luu
(74) *Attorney, Agent, or Firm*—Heller Ehrman LLP (57) ABSTRACT

A semiconductor memory device including an internal clock doubler including an internal clock doubler for doubling an external clock signal in a read mode to output a double clock signal in response to a plurality of external control signals, and delaying the external clock signal to output a clock control signal; a sense amplifier control signal generator for receiving the clock control signal and a standby signal of the plurality of external control signals signals which represents an output state of data to generate a plurality of sense amplifier control signals for controlling output of output data of a sense amplifier; a sense amplifier output unit for outputting output data of the sense amplifier in response to the plurality of sense amplifier control signals; and an output buffer unit for outputting output data of the sense amplifier synchronously with respect to the double clock signal in response to the standby signal when data are outputted.

27 Claims, 8 Drawing Sheets

SEMICONDUCTOR MEMORY DEVICE INCLUDING INTERNAL CLOCK DOUBLER

BACKGROUND OF THE INVENTION

1. Field of the Invention

The present invention generally relates to a semiconductor memory device including an internal clock doubler, and more specifically, to a technology of holding output data for 2 clocks only when data are outputted in a read mode.

2. Description of the Prior Art

A random access memory (hereinafter, referred to as "RAM") of semiconductor memories which can access randomly to a memory place and perform both write and read operations of information has been widely used in a memory device of computer and its peripheral terminal equipment.

The RAM includes a dynamic RAM for performing a refresh operation for each predetermined period not to delete information and a static RAM whose information is not deleted only if the static RAM is connected to power.

Although the static RAM is easily connected to other integrated circuits, the static RAM requires more than 3~4 times devices if it is used with the same memory capacity as that of the dynamic RAM. As a result, the static RAM becomes more complicated and expensive.

Recently, studies have been made on a pseudo SRAM for performing the same operation as that of the static RAM using a cell of the dynamic RAM. In the pseudo SRAM, the chip size becomes smaller than that of the conventional static RAM, and high integration such as 16 Mbit, 32 Mbit and 64 Mbit can be embodied.

The pseudo SRAM outputs data with 1 clock hold or 2 clock holds. In the 1 clock hold, outputted data are maintained only for 1 clock, and other data are outputted if the next clock enters. In the 2 clock holds, outputted data are maintained for 2 clocks, and other data are outputted if the next clock enters. That is, during the 2 clock holds, if data are outputted in the first clock, the data are maintained until the second clock, and if other data are outputted in the third clock, the other data are maintained until the fourth clock.

In this way, the conventional semiconductor memory device uses an internal clock doubler in order to continuously maintain output data for 2 clocks.

However, the conventional semiconductor memory device holds data for 2 clocks in a read mode as well as in a write mode unnecessarily by using an internal clock doubler. As a result, the whole operation time of the chip increases.

SUMMARY OF THE INVENTION

Accordingly, it is an object of the present invention to prevent increase of the whole operation time of the chip by holding output data for 2 clocks only in a read mode in response to a write enable bar signal /WE.

It is another object of the present invention to prevent increase of read time by holding output data for 2 clocks only when data are actually outputted although a read command is inputted using a standby signal.

In an embodiment, a semiconductor memory device including an internal clock doubler comprises an internal clock doubler, a sense amplifier control signal generator, a sense amplifier output unit and an output buffer unit. The internal clock doubler doubles an external clock signal in a read mode to output a double clock signal in response to a plurality of external control signals, and delays the external clock signal to output a clock control signal. The sense amplifier control signal generator receives the clock control signal and a standby signal of the plurality of external control signals which represents an output state of data to generate a plurality of sense amplifier control signals for controlling output of output data of a sense amplifier. The sense amplifier output unit outputs output data of the sense amplifier in response to the plurality of sense amplifier control signals. The output buffer unit outputs output data of the sense amplifier synchronously with respect to the double clock signal in response to the standby signal when data are outputted.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
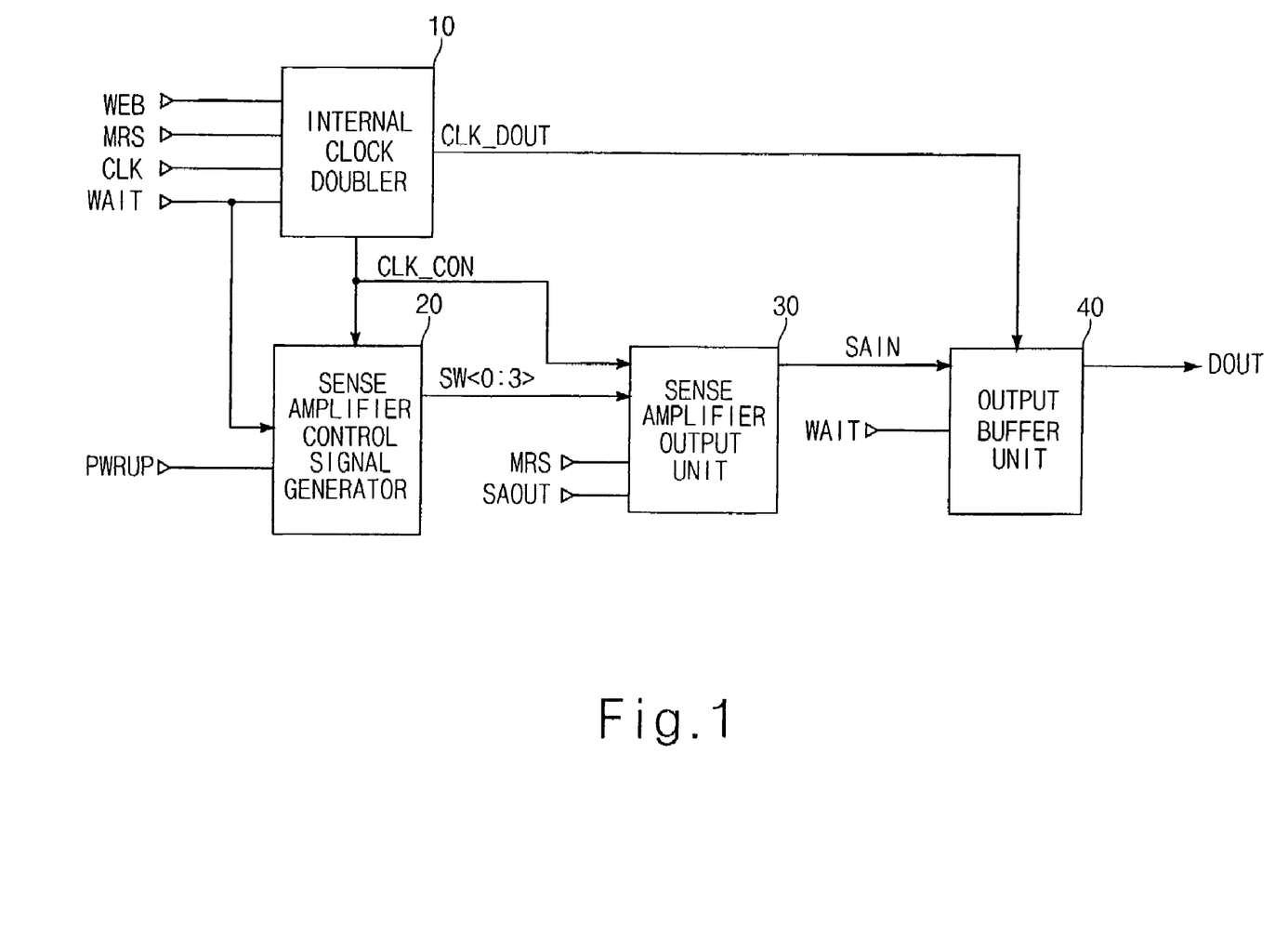
FIG. 1 is a diagram illustrating a semiconductor memory device including an internal clock doubler according to an embodiment of the present invention.

FIG. 1 is a diagram illustrating a semiconductor memory device including an internal clock doubler according to an embodiment of the present invention.

In an embodiment, the semiconductor memory device comprises an internal clock doubler 10, a sense amplifier control signal generator 20, a sense amplifier output unit 30 and an output buffer unit 40.

The internal clock doubler 10 receives a write enable bar signal WEB, a mode register setting signal MRS, an external clock signal CLK and a standby signal WAIT, and outputs a double clock signal CLK_DOUT by doubling a clock period of the external clock signal CLK if data are outputted. Also, the internal clock doubler 10 delays the external clock signal CLK to output a clock control signal CLK_CON.

The sense amplifier control signal generator 20 outputs a sense amplifier control signal SW<0:3> for controlling output of a sense amplifier by using the clock control signal CLK_CON and the standby signal WAIT. Here, the sense amplifier control signal SW<0:3> controls when sense amplifier output data SAOUT sensed in each 1 clock is outputted to the output buffer unit 40.

The sense amplifier output unit 30 receives the sense amplifier control signal SW<0:3>, a power-up signal PWRUP, the mode register setting signal MRS, the sense amplifier output data SAOUT and the clock control signal CLK_CON, and outputs a selecting data SAIN.

The sense amplifier output unit 30 controls an output timing of the sense amplifier output data SAOUT in response to the sense amplifier control signal SW<0:3>. That is, although a sense amplifier (not shown) outputs data in each 1 clock in a read modes the sense amplifier output unit 30 is controlled by the sense amplifier control signal SW<0:3> and holds output data for 2 clocks to output the data.

The output buffer unit 40 receives the double clock signal CLK_DOUT and the selecting data SAIN, and holds the selecting data SAIN for 2 clocks synchronously with respect to the double clock signal CLK_DOUT in response to the standby signal WAIT to output the selecting data SAIN. Here, the standby signal WAIT is maintained at a low level before data are outputted, and transits to a high level if the data start to be outputted. Accordingly, the output buffer unit 40 holds output data for 2 clocks after the data are outputted in response to the standby signal WAIT.

Figure 2:
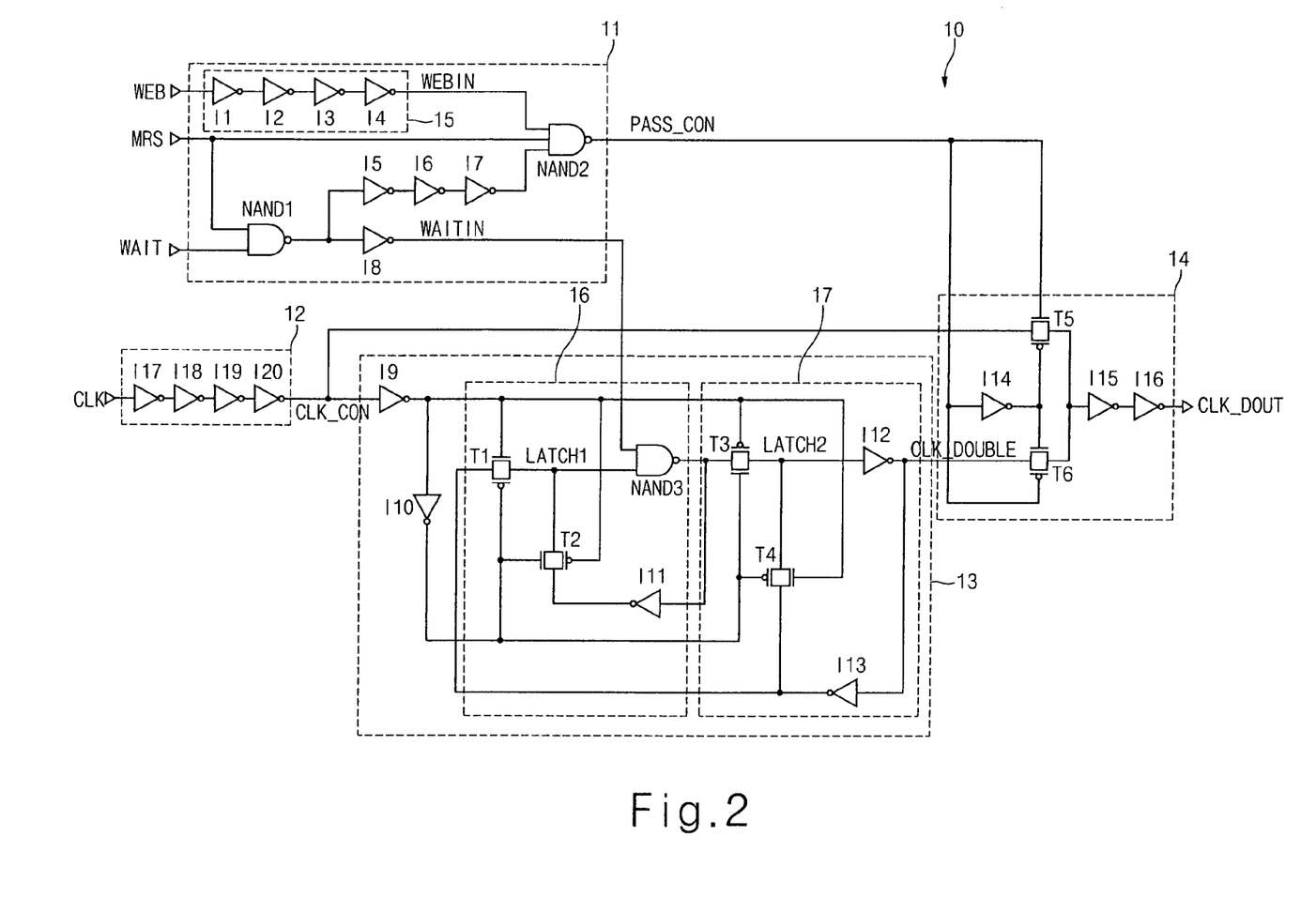
FIG. 2 is a circuit diagram of an internal clock doubler of FIG. 1.

FIG. 2 is a circuit diagram of the internal clock doubler 10 of FIG. 1.

The internal clock doubler comprises an input unit 11, a clock delay unit 12, a clock doubling unit 13 and an output unit 14.

The input unit 11 comprises a write enable bar buffer output unit 15, NAND gates NAND1 and NAND2 and inverters I5~I8.

The write enable bar buffer output unit 15 which comprises a plurality of inverter chains I1~I4 buffers a write enable bar signal WEB to output a write enable bar input signal WEBIN.

The NAND gate NAND1 performs a NAND operation on the mode register setting signal MRS and the standby signal WAIT. The inverters I5~I7 delay an output signal from the NAND gate NAND1, and outputs the delayed signal to the NAND gate NAND2. The inverter 18 inverts the output signal from the NAND gate NAND1 to output a standby input signal WAITIN.

Here, the standby signal WAIT is enable when data are outputted.

The NAND gate NAND2 performs a NAND operation on the write enable bar input signal WEBIN, the mode register setting signal MRS and output signals from the inverters I5~I7, and outputs an output control signal PASS_CON for controlling the output unit 14. Here, the semiconductor memory device is operated at 1 clock hold if the mode register setting signal MRS is at a low level, and the semiconductor memory device is operated at 2 clock hold if the mode register setting signal MRS is at a high level. If the write enable bar input signal WEBIN is at a low level, the semiconductor memory device performs a write operation, and if the write enable bar input signal WEBIN is at a high level, the semiconductor memory device performs a read operation.

The clock delay unit 12 comprises inverters I17~I20 for delaying the external clock signal CLK to output the clock control signal CLK_CON. Here, the clock control signal CLK_CON for delaying the external clock signal CLK has the same frequency phase as that of the external clock signal CLK.

The clock doubling unit 13 which comprises inverters 19 and 110, and latch units 16 and 17 doubles the clock control signal CLK_CON.

The latch unit 16 as a selecting non-inversion latch circuit comprises transmission gates T1 and T2, an inverter I11 and a NAND gate NAND3. The transmission gate T1 is controlled by output signals from the inverters I9 and I10, and transmits an output signal from an inverter I13 to a node LATCH1 to initialize the node LATCH1. The transmission gate T2 is controlled by the output signals inverters I9 and I10, and transmits an output signal from the inverter I11 to the node LATCH1.

For example, if the output signal from the inverter 19 is at a high level, the transmission gate T1 is turned on and the transmission gate T2 is turned off. As a result, an output signal from the inverter I13 is transmitted to the node LATCH1, and the NAND gate NAND1 transmits an unlatched signal of the node LATCH1 to a transmission gate T3 when the standby input signal WAITIN is at a low level. Meanwhile, if the output signal from the inverter I9 is at a low level, the transmission gate T1 is turned off and the transmission gate T2 is turned on. As a result, the output signal from the inverter I11 is transmitted to the node LATCH1 and latched. That is, if the transmission gate T2 is turned on, the NAND gate NAND3 and the inverter I11 form a latch structure. Here, the operation of the signal of the node LATCH1 is shown in the timing diagram of FIG. 9.

The latch unit 17 as a selecting non-inversion latch circuit comprises transmission gates T3 and T4, inverters I12 and I13. The transmission gate T3 is controlled by the output signals from the inverters I9 and I10, and transmits an output signal from the NAND gate NAND3 to a node LATCH2. The transmission gate T4 is controlled by the output signals from the inverters I9 and I10, and transmits the output signal from the inverter 113.

For example, if the output signal from the inverter 19 is at the high level, the transmission gate T3 is turned off and the transmission gate T4 is turned on. As a result, the output signal from the inverter I13 is transmitted to the node LATCH2, and the inverters I12 and I13 form a latch structure. Meanwhile, if the output signal from the inverter I10 is at a high level, the transmission gate T3 is turned on and the transmission gate T4 is turned off. As a result, an output signal from the NAND gate NAND3 is transmitted to the node LATCH2. Here, the operation of the signal of the node LATCH2 is shown in the timing diagram of FIG. 9.

The clock doubling unit 13 latches the clock control signal CLK_CON received from the clock delay unit 12 through latch units 16 and 17, and outputs a double clock signal CLK_DOUBLE.

The output unit 14 comprises transmission gates T5 and T6, and inverters I14~I16.

The transmission gates T5 and T6 are controlled by the output control signal PASS_CON and an output signal from the inverter I14, and transmit the clock control signal CLK_CON and the double clock signal CLK_DOUBLE as input of the inverter I15, respectively. As a result, output signals from the transmission gates T5 and T6 are buffered through the inverters I15 and I16, and outputted as final clock signals CLK_DOUT.

Hereinafter, the operation of the internal clock doubler 10 of FIG. 2 is described.

If the mode register setting signal MRS, the standby signal WAIT and the write enable bar signal WEB are all at a low level, the transmission gate T6 is turned off and the transmission gate T5 is turned on. As a result, the internal clock doubler 10 outputs the clock control signal CLK_CON.

Meanwhile, if the mode register setting signal MRS, the standby signal WAIT and the write enable bar signal WEB are at a high level, and the clock control signal CLK_CON is at a low level, the transmission gates T1, T4 and T6 are turned on. As a result, the internal clock doubler 10 outputs a value of the node LATCH2. On the other hand, if the mode register setting signal MRS, the standby signal WAIT and the write enable bar signal WEB are at the high level, and the clock control signal CLK_CON is at a high level, the transmission gates T2, T3 and T5 are turned on, the internal clock doubler 10 transmits a value of the node LATCH1 to the node LATCH2, and outputs a value of the node LATCH2. The internal clock doubler 10 performs the above-described process repeatedly, and outputs the double clock signal CLK_DOUT having twice frequency of the external clock signal CLK.

Figure 3:
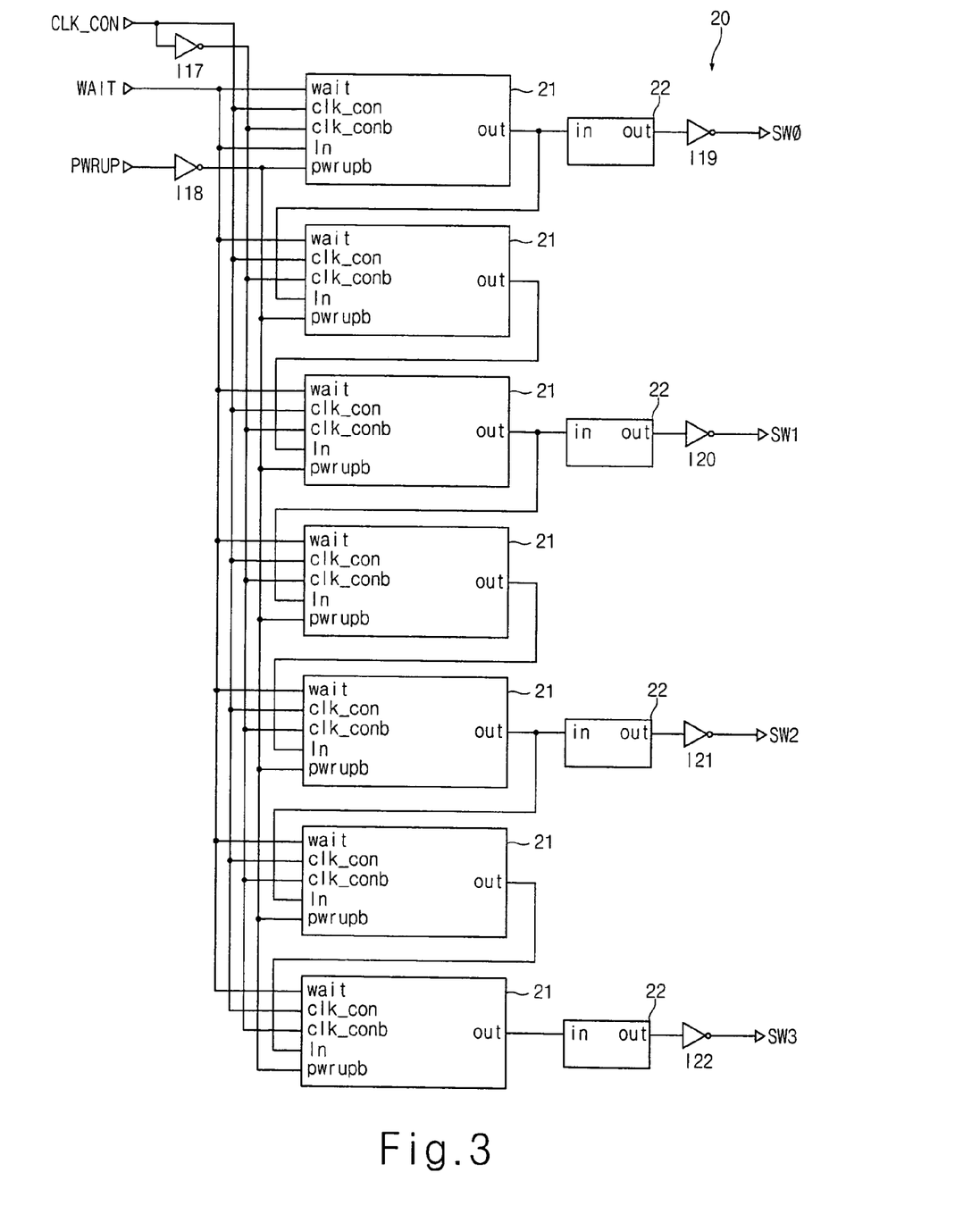
FIG. 3 is a circuit diagram of a sense amplifier control signal generator of FIG. 1.

FIG. 3 is a circuit diagram of the sense amplifier control signal generator 20 of FIG. 1.

The sense amplifier control signal generator 20 comprises a plurality of clock shifters 21, a plurality of sense amplifier control signal selecting units 22 and inverters I17~I22.

The plurality of clock shifters 21 receive the standby signal WAIT, the clock control signal CLK_CON and the power-up signal PWRUP, respectively, and outputs a signal for controlling the plurality of sense amplifier control signal selecting units.

The plurality of sense amplifier control signal selecting units 22 receive output signals from the plurality of clock shifters 21, respectively, and output the sense amplifier control signals SW<0:3>.

The inverters I17 and I18 invert the clock control signal CLK_CON and the power-up signal PWRUP, and inverters I19~I22 invert output signals from the plurality of sense amplifier control signal selecting units 22.

Figure 4:
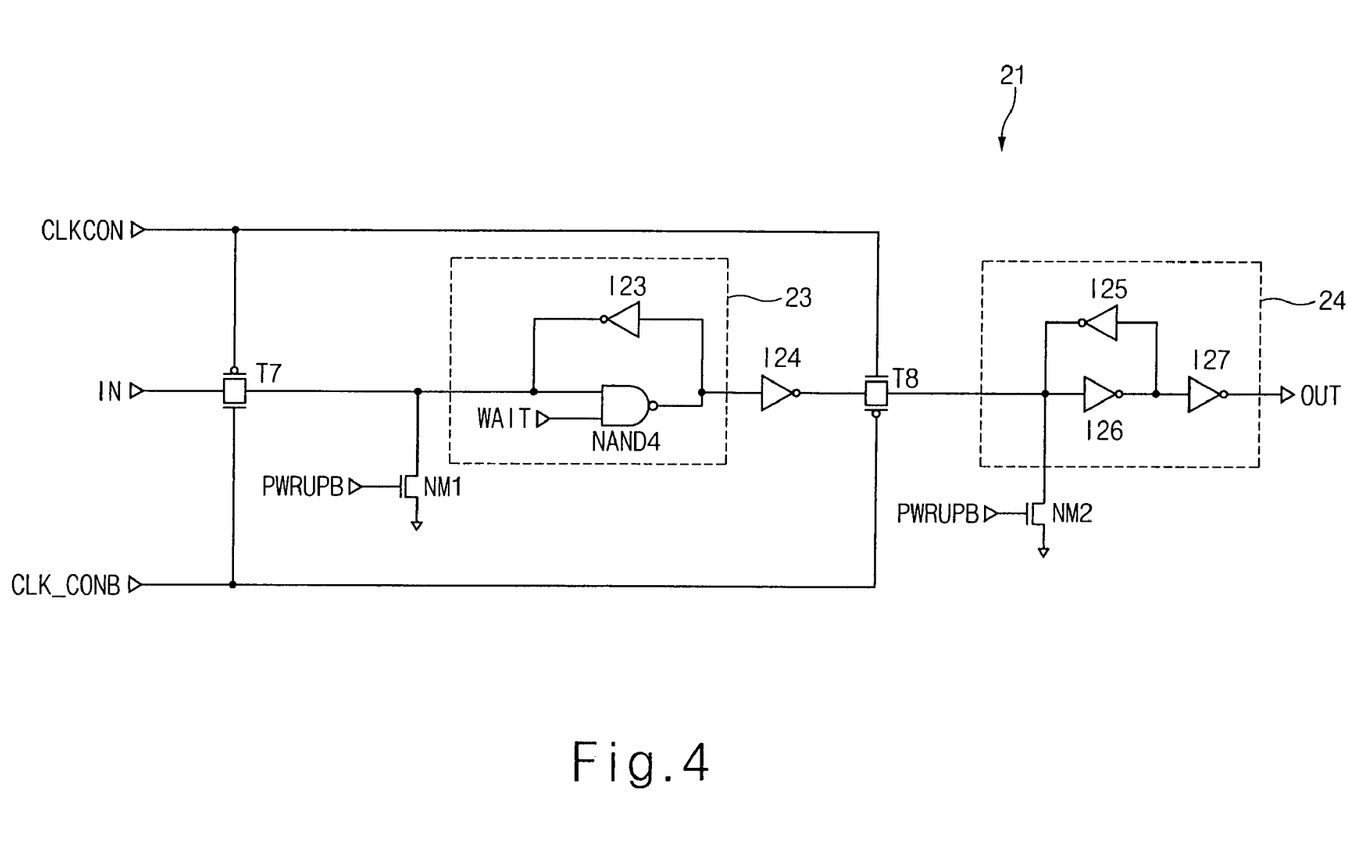
FIG. 4 is a circuit diagram of a clock shifter of FIG. 3.

FIG. 4 is a circuit diagram of the clock shifter 21 of FIG. 3.

The clock shifter 21 comprises transmission gates T7 and T8, NMOS transistors NM1 and NM2, latch units 23 and 24 and inverter I24, I27.

The transmission gate T7 is controlled by a signal CLK_CONB having the opposite phase to those of the clock control signal CLK_CON and the clock control signal CLK_CON, and transmits an input signal IN as input of a NAND gate NAND4.

The latch unit 23 comprises the NAND gate NAND4 and an inverter I23.

The NAND gate NAND4 selectively outputs an output signal from the transmission gate T7 in response to the standby signal WAIT. The inverter I23 inverts an output signal from the NAND gate NAND4, and transmits the inverted signal as input of the NAND gate NAND4.

The transmission gate T8 is controlled by the clock control signals CLK_CON and CLK_CONB, and transmits an output signal from the inverter I24.

The latch unit 24 which comprises inverters I25 and I26 latches an output signal from the transmission gate T8.

The NMOS transistors NM1 and NM2 is controlled by a power-up bar signal PWRUPB having the opposite phase to that of the power-up signal PWRUP, and initialize the output terminal of transmission gates T7 and T8.

Hereinafter, the operation of the clock shifter 21 is described.

The transmission gate T7 is turned on if the clock control signal CLK_CON is at a low level, and transmits the input signal IN to the latch unit 23.

The NAND gate NAND4 outputs a high level signal if the standby signal WAIT is at a low level, and the inverter I24 inverts the output signal from the NAND gate NAND4. Then, when the clock control signal CLK_CON is at a high level, the transmission gate T8 is turned on and transmits the output signal from the inverter I24 to an output terminal.

Here, while the standby signal WAIT is at the low level, the output signal from the NAND gate NAND4 becomes at a high level and an output signal OUT from the clock shifter 21 is always at a low level, thereby preventing the sense amplifier control signal SW<0:3> from being enabled.

When the standby signal WAIT transits from the low level to a high level, the output signal OUT from the clock shifter 21 also transits from the low level to a high level. In response to the output signal OUT, the sense amplifier control signal selecting unit 22 selectively outputs the sense amplifier control signal SW<0:3>.

Figure 5:
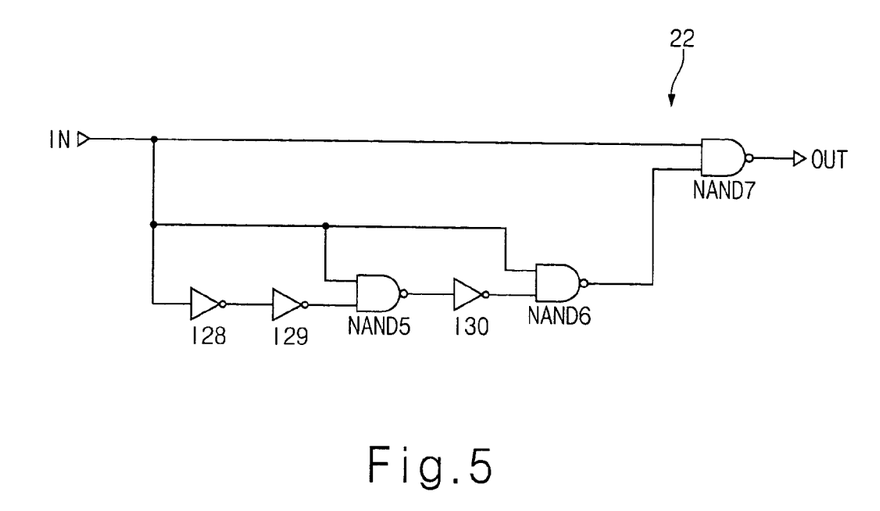
FIG. 5 is a detailed circuit diagram of a sense amplifier control signal selecting unit of FIG. 3.

FIG. 5 is a detailed circuit diagram of the sense amplifier control signal selecting unit 22 of FIG. 3.

The sense amplifier control signal selecting unit 22 which comprises inverters I28~I30 and NAND gates NAND5~NAND7 outputs a short pulse signal.

The NAND gate NAND5 performs a NAND operation on the input signal IN and a signal sequentially inverted by the inverters I28 and I29. The inverter I30 inverts an output signal from the NAND gate NAND5. The NAND gate NAND6 performs a NAND operation on the input signal IN and an output signal from the inverter I30. The NAND gate NAND7 performs a NAND operation on the input signal IN and an output signal from the NAND gate NAND6.

The plurality of sense amplifier control signal selecting units 22 selectively output the sense amplifier control signals SW0~SW3 in response to output signal from the plurality of clock shifters 21.

Figure 6:
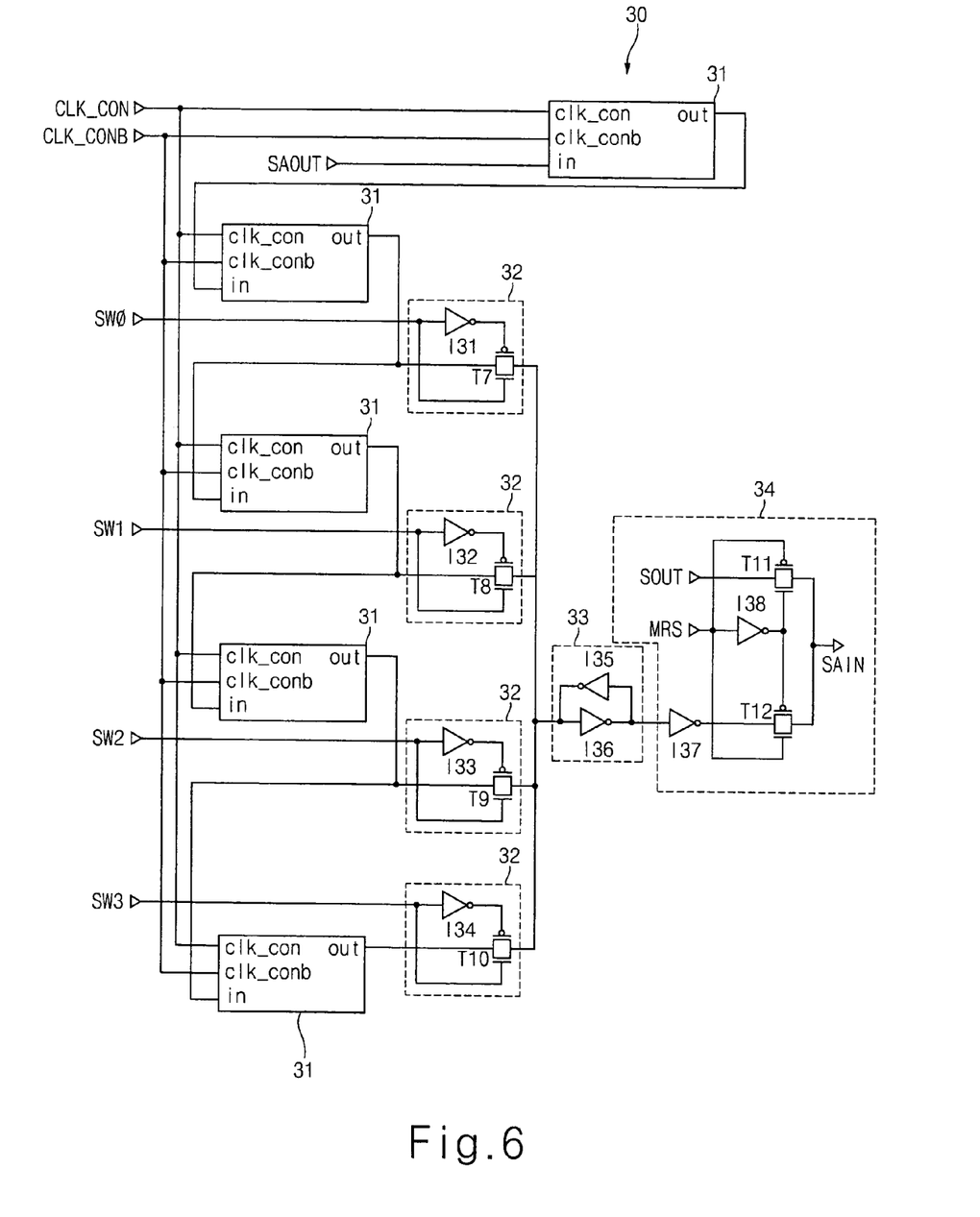
FIG. 6 is a circuit diagram of a sense amplifier output unit of FIG. 1.

FIG. 6 is a circuit diagram of the sense amplifier output unit 30 of FIG. 1.

The sense amplifier output unit 30 comprises a plurality of clock shifters 31, a plurality of transmission unit 32, a latch unit 33 and an output unit 34.

The plurality of clock shifters 31 shift sense amplifier output data SAOUT synchronously with respect to the clock control signals CLK_CON and CLK_CONB, and transmit an output signal as input of the next clock shifter 31.

The plurality of transmission unit 32 which comprises inverters I31 and I34, and transmission gates T7~T10 is controlled by the sense amplifier control signal SW<0:3>, and transmits output signals from each clock shifter 31 to the latch unit 33.

The latch unit 33 which comprises inverters I35 and I36 latches output signals from the plurality of transmission unit 32.

The output unit 34 comprises inverters I37 and I38, and transmission gates T11 and T12.

The inverter I37 inverts an output signal from the latch unit 33, and the inverter I38 inverts the mode register setting signal MRS. The transmission gates T11 and T12 are controlled by an output signal from the inverter I38 and the mode register setting signal MRS, and transmit the sense amplifier output data SAOUT and an output signal from the inverter I37.

The output unit 34 turns on the transmission gate T11 by the mode register setting signal MRS at the low level during the 1 clock hold operation, and outputs the sense amplifier output data SAOUT as selecting data SAIN. During the 2 clock hold operation, the output unit 34 turns on the transmission gate T12 by the mode register setting signal MRS at the high level, and outputs an output signal from the inverter I37 as the selecting data SAIN.

The above-described sense amplifier output unit 30 continuously shifts the sense amplifier output data SAOUT synchronously with respect to the external clock signal CLK, and selects one of the shifted sense amplifier output data SAOUT as the selecting data SAIN to the output buffer unit 40 in response to the sense amplifier control signals SW0~SW3 selectively enabled synchronously with respect to the data signal DOUT.

Figure 7:
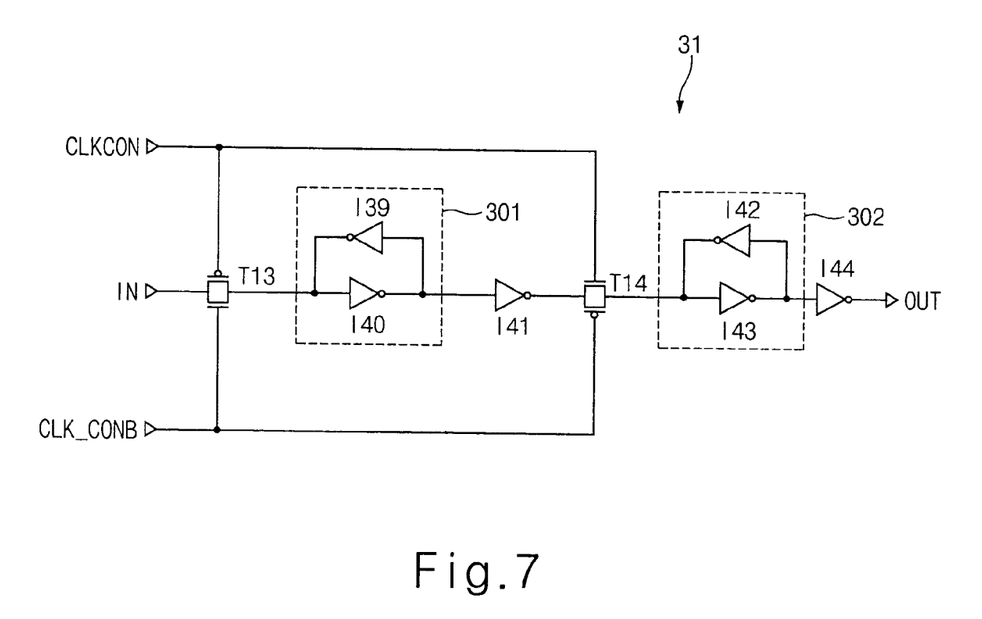
FIG. 7 is a detailed circuit diagram of a clock shifter of FIG. 6.

FIG. 7 is a detailed circuit diagram of the clock shifter 31 of FIG. 6.

The clock shifter 31 comprises transmission gates T13 and T14, latch units 301 and 302, and inverters I41, I44.

The transmission gate T13 is controlled by the clock control signals CLK_CON and CLK_CONB, and transmits an input signal IN to the latch unit 301. The latch unit 301 which comprises inverters I39 and I40 latches an output signal from the transmission gate T13.

The inverter I41 inverts an output signal from the latch unit 301, and outputs the inverted signal to the transmission gate T14. The transmission gate T14 is controlled by the clock signals CLK_CON and CLK_CONB, and transmits an output signal from the inverter I41 to a latch unit 302. The latch unit 302 which comprises inverters I42 and I43 latches an output signal from the transmission gate T14. The inverter I44 inverts an output signal from the latch unit 302.

Figure 8:
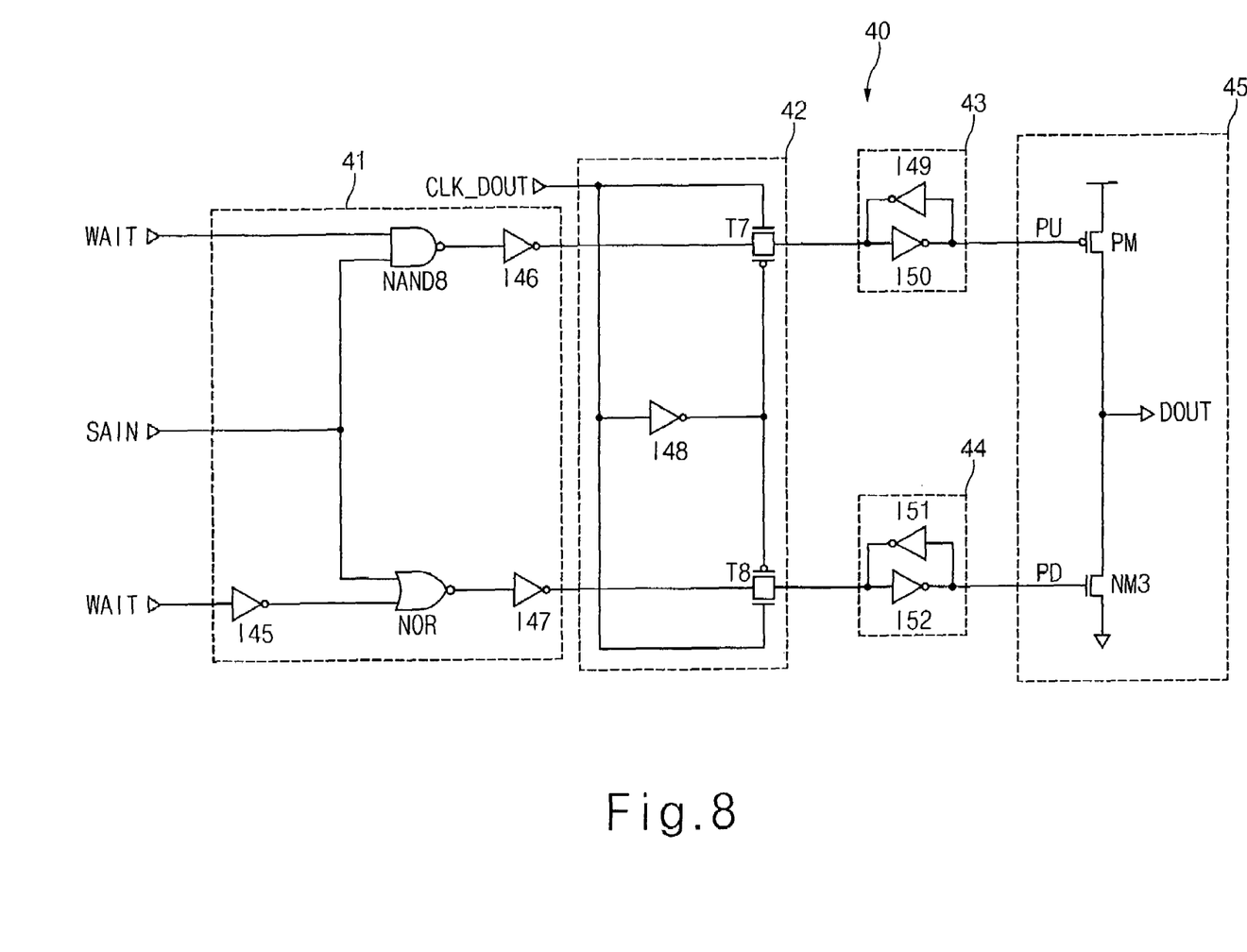
FIG. 8 is a circuit diagram of an output buffer unit of FIG. 1.

FIG. 8 is a circuit diagram of the output buffer unit 40 of FIG. 1.

The output buffer unit 40 comprises a logic operation unit 41, a transmission unit 42, latch units 43 and 44, and a driving unit 45.

The logic operation unit 41 comprises inverters I45~I47, a NAND gate NAND8 for performing a NAND operation on the standby signal WAIT and the selecting data SAIN, and a NOR gate NOR for performing a NOR operation on the standby signal WAIT and the selection data SAIN.

The transmission unit 42 comprises an inverter I48 for inverting the double clock signal CLK_DOUT, and transmission gates T7 and T8 which are controlled by the double clock signal CLK_DOUT respectively, and transmit an output signal from the logic operation unit 41 to the latch units 43 and 44.

The latch unit 43 comprises inverters I49 and I50, and the latch unit 44 comprises inverters I51 and I52. The latch units 43 and 44 latch an output signal from the transmission unit 42 at a predetermined level.

The driving unit 45 which comprises a PMOS transistor PM and a NMOS transistor NM3 is controlled by output signals PU and PD from the latch units 43 and 44, and outputs the data signal DOUT.

In the above-described output buffer unit 40, if the standby signal WAIT is at the low level, the output signal PU from the latch unit 43 becomes at a high level and the output signal PD from the latch unit 44 becomes at a low level. As a result, the driving unit 45 is not operated, and the data signal DOUT becomes at a floating state.

Thereafter, when data start to be outputted, the standby signal WAIT becomes at the high level and the output signal PU becomes at a low level, thereby driving the PMOS transistor PM to output the data output signal DOUT. If the transmission gates T7 and T8 transmit an output signal from the logic operation unit 41 to the latch units 43 and 44 in response to the double clock signal CLK_DOUT, the PMOS transistor PM is driven and holds the selecting data SAIN for 2 clocks to output the selecting data SAIN as output data DOUT.

Figure 9:
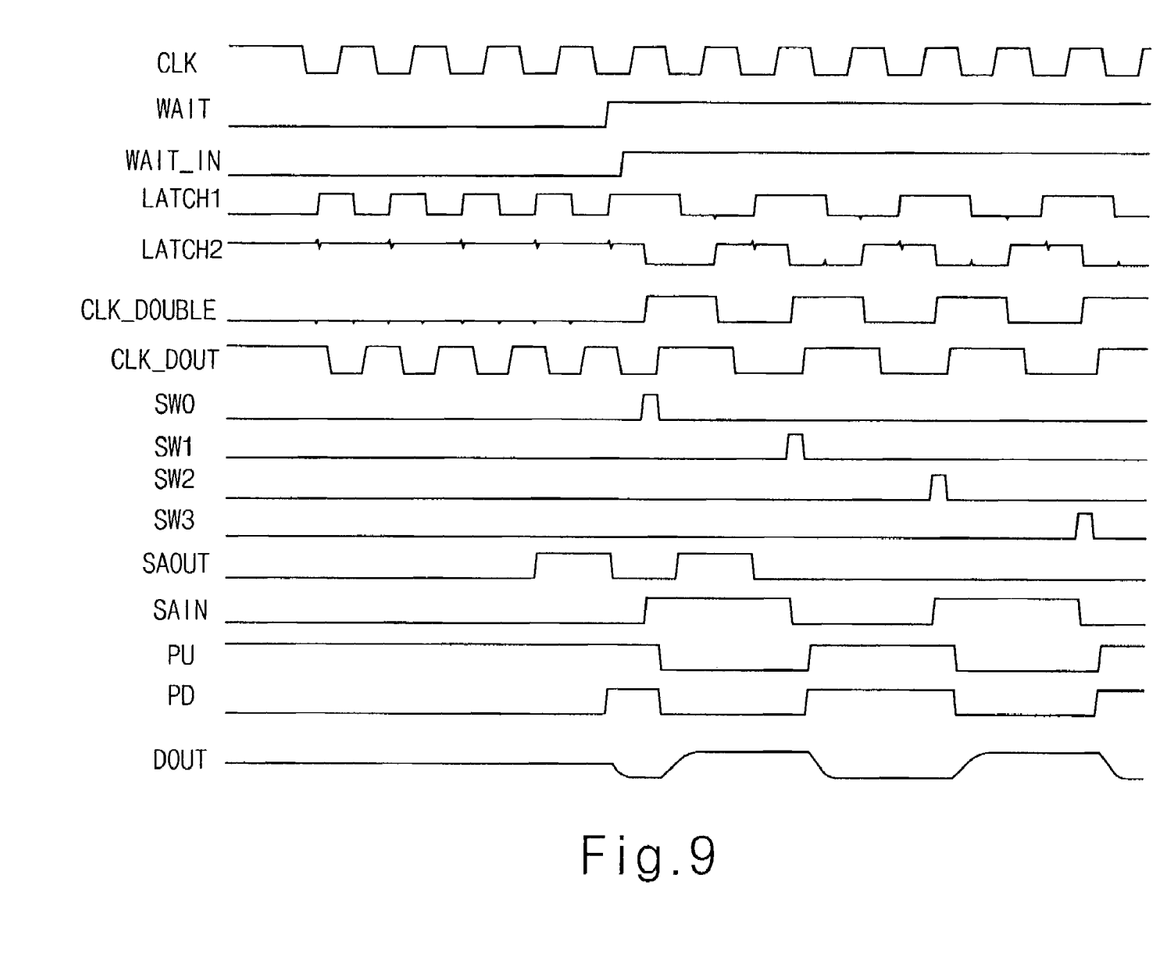
FIG. 9 is a timing diagram illustrating the operation of a semiconductor memory device including an internal clock doubler according to an embodiment of the present invention.

FIG. 9 is a timing diagram illustrating the operation of a semiconductor memory device including an internal clock doubler according to an embodiment of the present invention.

During the read mode, when data start to be outputted, the standby signal WAIT is enabled. If the standby signal WAIT at the high level is inputted, the internal clock doubler 10 doubles the external clock signal CLK through the clock doubling unit 13 and outputs the double clock signal CLK_DOUBLE. During the read mode, the output unit 14 outputs the double clock signal CLK_DOUBLE as a double clock CLK_DOUT. As shown in FIG. 9, the double clock CLK_DOUT has twice clock frequency of the external clock signal CLK.

Thereafter, the sense amplifier control signal generator 20 sequentially outputs the sense amplifier control signal SW<0:3>, and sequentially generates the sense amplifier output data SAOUT as the selecting data SAIN.

The output buffer unit 40 receives the selecting data SAIN in response to the standby signal WAIT, and outputs data DOUT synchronously with respect to the double clock CLK_DOUT at a 2 clock hold.

As discussed earlier, a semiconductor memory device including an internal clock doubler in an embodiment of the present invention can reduce read time by doubling an internal clock period only when data are actually outputted in a read mode to maintain output data for 2 clocks.

What is claimed is:

1. A semiconductor memory device including an internal clock doubler, comprising:
    an internal clock doubler for doubling an external clock signal in a read mode to output a double clock signal in response to a plurality of external control signals, and delaying the external clock signal to output a clock control signal;
    a sense amplifier control signal generator for receiving the clock control signal and a standby signal of the plurality of external control signals which represents an output state of data to generate a plurality of sense amplifier control signals for controlling output of output data of a sense amplifier;
    a sense amplifier output unit for outputting output data of the sense amplifier in response to the plurality of sense amplifier control signals; and
    an output buffer unit for outputting output data of the sense amplifier synchronously with respect to the double clock signal in response to the standby signal when data are outputted.

2. The device according to claim 1, wherein the internal clock doubler comprises:
    an input unit for logically combining the plurality of external control signals to output an output control signal;
    a clock delay unit for delaying the external clock signal to output the clock control signal;
    a clock doubling unit for doubling the external clock signal by using the standby signal to output the double clock signal; and
    an output unit controlled by the output control signal and for selectively outputting the clock control signal and the double clock signal.

3. The device according to claim 2, wherein the input unit comprises:
    a buffering unit for buffering a write enable bar signal of the plurality of external control signals which represents the read mode;
    a first logic operation unit for logically operating a mode register setting signal and the standby signal of the plurality of external control signals;
    a delay unit for delaying output of the first logic operation unit; and
    a second logic operation unit for logically operating output signals from the buffering unit and the delay unit with the mode register setting signal.

4. The device according to claim 3, wherein the buffering unit comprises the even number of inverters.

5. The device according to claim 3, wherein the first logic operation unit comprises a NAND gate for performing a NAND operation on the standby signal and the mode register setting signal.

6. The device according to claim 3, wherein the delay unit comprises the odd number of inverters.

7. The device according to claim 3, wherein the second logic operation unit is a NAND gate.

8. The device according to claim 2, wherein the clock doubling unit comprises:
a first latch unit controlled by the clock control signal and for latching an output signal at a predetermined level; and
a second latch unit connected to an output terminal of the first latch unit, controlled by the clock signal and for latching an output signal.

9. The device according to claim 8, wherein the first latch unit comprises:
an initialization transmission gate controlled by the clock control signal and for initializing the first latch unit;
a latch for latching an output signal from the first latch unit; and
a latch transmission gate controlled by the clock control signal, operated opposite to the initialization transmission gate and for transmitting an output signal from the latch to an input terminal of the latch.

10. The device according to claim 9, wherein the latch comprises:
a NAND gate for selectively outputting one of output signals from the initialization transmission gate or the latch transmission gate in response to the standby signal; and
an inverter for inverting an output signal from the NAND gate and outputting the inverted signal to an input terminal of the latch transmission gate.

11. The device according to claim 8, wherein the second latch unit comprises:
an initialization transmission gate controlled by the clock control signal and for transmitting an output signal from the first latch unit;
a latch transmission gate controlled by the external clock signal and for transmitting an output signal from the second latch unit; and
a latch for latching an output signal from the second latch unit when the latch transmission gate is turned on.

12. The device according to claim 11, wherein the latch comprises:
a first inverter for inverting one of output signals from the initialization transmission gate or the latch transmission gate; and
a second inverter for inverting an output signal from the first inverter and outputting the inverted signal to an input terminal of the latch transmission gate.

13. The device according to claim 2, wherein the output unit comprises:
a first transmission gate controlled by the output control signal and for transmitting the clock control signal;
a second transmission gate controlled by the output control signal and for transmitting the double clock signal; and
a buffering unit for buffering one of output signals from the first transmission gate or the second transmission gate.

14. The device according to claim 13, wherein in response to the output control signal, the output unit outputs the double clock signal in a read mode, and outputs the clock control signal in a write mode.

15. The device according to claim 1, wherein the sense amplifier control signal generator comprises:
a plurality of clock shifters controlled by the clock control signal and for clock-shifting the standby signal; and
a plurality of sense amplifier control signal selecting units controlled by output signals from the plurality of clock shifters and for sequentially outputting a plurality of sense amplifier control signals.

16. The device according to claim 15, wherein each of the plurality of clock shifters comprises:
a first transmission gate controlled by the clock control signal and for transmitting the standby signal and output signal from the previous clock shifter to an output terminal;
a first latch unit for latching an output signal from the first transmission gate;
a second transmission gate controlled by the clock control signal and for transmitting an output signal from the first latch unit; and
a second latch unit for latching an output signal from the second transmission gate.

17. The device according to claim 16, further comprising a NMOS transistor controlled by a power-up bar signal having an opposite phase to a power-up signal and for initializing an output terminal of the first transmission gate and the second transmission gate.

18. The device according to claim 16, wherein the first latch unit comprises:
a NAND gate for selectively outputting an output signal from the first transmission gate in response to the standby signal; and
an inverter for inverting an output signal from the NAND gate and outputting the inverted signal to an input terminal of the NAND gate.

19. The device according to claim 16, wherein the second latch unit comprises:
a first inverting unit for inverting an output signal from the second transmission gate; and
a second inverting unit for inverting an output signal from the first inverting unit and outputting the inverted signal to an input terminal of the first inverting unit.

20. The device according to claim 15, wherein each of the plurality of sense amplifier control signal selecting unit comprises:
a plurality of inverters for delaying an output signal from the clock shifter;
a first logic operation unit for logically operating output signals from the plurality of inverters and an output signal from the clock shifter;
a second logic operation unit for logically operating an output signal from the first logic operation unit and an output signal from the clock shifter; and
a third logic operation unit for logically operating an output signal from the second logic operation unit and an output signal from the clock shifter.

21. The device according to claim 1, wherein the sense amplifier output unit comprises:
a plurality of clock shifters controlled by the clock control signal and for shifting the sense amplifier output data and outputting the shifted output as an input of the next clock shifter;
a plurality of transmission units for transmitting output selected by the sense amplifier control signal of output signals from the plurality of clock shifters;

a latch unit for latching output of the plurality of transmission units; and an output unit for selectively outputting an output signal from the latch unit and the sense amplifier output data in response to the mode register setting signal.

22. The device according to claim 21, wherein each of the plurality of clock shifters comprises:

a first transmission gate controlled by the clock control signal and for transmitting the sense amplifier output data and an output signal from the previous clock shifter;

a first latch unit for latching an output signal from the first transmission gate;

a second transmission gate controlled by the clock control signal and for transmitting an output signal from the first latch unit; and a second latch unit for latching an output signal from the second transmission gate.

23. The device according to claim 1, wherein the output buffer unit comprises:

a first input unit and a second input unit for selectively outputting the sense amplifier output data in response to the standby signal;

a transmission unit for selectively transmitting output signals from the first input unit and the second input unit in response to the double clock signal;

a first latch unit and a second latch unit for latching an output signal from the transmission unit; and a driving unit controlled by output signals from the first latch unit and the second latch unit and for driving one of a power voltage or a ground voltage.

24. The device according to claim 23, wherein the first input unit comprises:

a NAND gate for selectively outputting the sense amplifier output data in response to the standby signal; and an inverting unit for inverting an output signal from the NAND gate.

25. The device according to claim 23, wherein the second input unit comprises:

a NOR gate for selectively outputting the sense amplifier output data in response to the standby signal; and an inverting unit for inverting an output signal from the NOR gate.

26. The device according to claim 23, wherein the transmission unit comprises:

a first transmission gate for transmitting an output signal from the first input unit if the double clock signal is enabled; and a second transmission gate for transmitting an output signal from the second input unit if the double clock signal is enabled.

27. The device according to claim 23, wherein the driving unit comprises:

a PMOS transistor controlled by an output signal from the first latch unit and for outputting the power voltage level to an output terminal; and a NMOS transistor controlled by an output signal from the second latch unit and for outputting the ground voltage level to an output terminal.

* * * * *